United States Patent
Chen et al.

(10) Patent No.: US 12,260,975 B2
(45) Date of Patent: Mar. 25, 2025

(54) OVER-VOLTAGE CIRCUIT PROTECTION DEVICE

(71) Applicant: FUZETEC TECHNOLOGY CO., LTD., New Taipei (TW)

(72) Inventors: Jack Jih-Sang Chen, New Taipei (TW); Chang-Hung Jiang, New Taipei (TW)

(73) Assignee: FUZETEC TECHNOLOGY CO., LTD., New Taipei (TW)

( * ) Notice: Subject to any disclaimer, the term of this patent is extended or adjusted under 35 U.S.C. 154(b) by 377 days.

(21) Appl. No.: 17/940,989

(22) Filed: Sep. 8, 2022

(65) Prior Publication Data

US 2024/0087778 A1 Mar. 14, 2024

(51) Int. Cl.
*H01C 7/12* (2006.01)
*H01C 7/108* (2006.01)
*H05K 1/02* (2006.01)
*H05K 1/11* (2006.01)

(52) U.S. Cl.
CPC ........... *H01C 7/12* (2013.01); *H01C 7/108* (2013.01); *H05K 1/0257* (2013.01); *H05K 1/115* (2013.01); *H05K 2201/0738* (2013.01)

(58) Field of Classification Search
CPC ........ H01C 7/12; H01C 7/108; H05K 1/0257; H05K 1/115; H05K 2201/0738
See application file for complete search history.

(56) References Cited

U.S. PATENT DOCUMENTS

| | | | | |
|---|---|---|---|---|
| 4,959,505 A * | 9/1990 | Ott | ........................... | H01G 2/06 338/21 |
| 5,266,739 A * | 11/1993 | Yamauchi | .............. | H01G 4/228 257/787 |
| 5,884,391 A * | 3/1999 | McGuire | .............. | H01C 1/1406 29/874 |
| 5,990,779 A * | 11/1999 | Katsuki | ................ | H01C 1/1406 338/234 |
| 6,172,590 B1 * | 1/2001 | Shrier | ..................... | H01L 23/62 361/111 |
| 7,053,468 B2 * | 5/2006 | Lee | ........................ | H01L 23/057 257/691 |
| 8,421,583 B2 * | 4/2013 | Koyama | ................ | H01C 7/028 338/223 |
| 10,181,718 B2 * | 1/2019 | De Leon | ................ | H02H 9/005 |

* cited by examiner

Primary Examiner — Kyung S Lee
(74) Attorney, Agent, or Firm — HSML P.C.

(57) ABSTRACT

An over-voltage circuit protection device includes a voltage-dependent resistor component, and a printed circuit board (PCB) component connected to the voltage-dependent resistor component through first and second conductive lead layers. The PCB component includes a PCB body, a first conductive portion, a second conductive portion, at least one first conductive via and at least one second conductive via. The first and second conductive portions are disposed on the PCB body, and are electrically insulated from each other. The first and second conductive vias extend through the PCB body, and are defined by via-defining walls respectively covered by the first and second conductive portions.

13 Claims, 3 Drawing Sheets

OVER-VOLTAGE CIRCUIT PROTECTION DEVICE

FIELD

The disclosure relates to an over-voltage circuit protection device.

BACKGROUND

Although a conventional over-voltage protection device such as a voltage-dependent resistor is capable of providing surge protection, such over-voltage protection device might only withstand a voltage surge for a short time period (such as 0.001 seconds). That is, if the time period of the voltage surge exceeds a cut-off time period, the conventional over-voltage protection device might burn out or be damaged, causing permanent loss of function thereof, and the malfunction and/or damage of circuit module. In addition, the conventional over-voltage protection device is usually manufactured with a DIP package which is not easy to be installed onto a relatively small printed circuit board.

Referring to FIG. 1, a conventional surface mountable over-voltage protection device includes a voltage-dependent resistor which includes a voltage-dependent resistor layer 91, and a first metal conductive layer 92 and a second metal conductive layer 93 that are respectively disposed on two opposite surfaces of the voltage-dependent resistor layer 91. The surface mountable over-voltage protection device further includes a first metal lead layer 94 bonded to the first metal conductive layer 92, a second metal lead layer 95 bonded to the second metal conductive layer 93, and an encapsulant 96 that encloses the voltage-dependent resistor, a portion of the first metal lead layer 94 and a portion of the second metal lead layer 95. However, such surface mountable over-voltage protection device still cannot provide required and satisfactory surge protection capacity.

SUMMARY

Therefore, an object of the disclosure is to provide an over-voltage circuit protection device that can alleviate at least one of the drawbacks of the prior art.

According to this disclosure, the over-voltage circuit protection device includes a voltage-dependent resistor component having two opposite resistor surfaces, a first and second conductive lead layers respectively disposed on the two opposite resistor surfaces of the voltage-dependent resistor component, and a printed circuit board (PCB) component. The PCB component includes a PCB body, a first conductive portion, a second conductive portion, at least one first conductive via and at least one second conductive via. The first conductive portion is disposed on the PCB body and is bonded to the first conductive lead layer. The second conductive portion is disposed on the PCB body, is electrically insulated from the first conductive portion, and is bonded to the second conductive lead layer. The at least one first conductive via is formed to extend through the PCB body, and is defined by a first via-defining wall which is covered by the first conductive portion. The at least one second conductive via is formed to extend through the PCB body, and is defined by a second via-defining wall which is covered by the second conductive portion.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
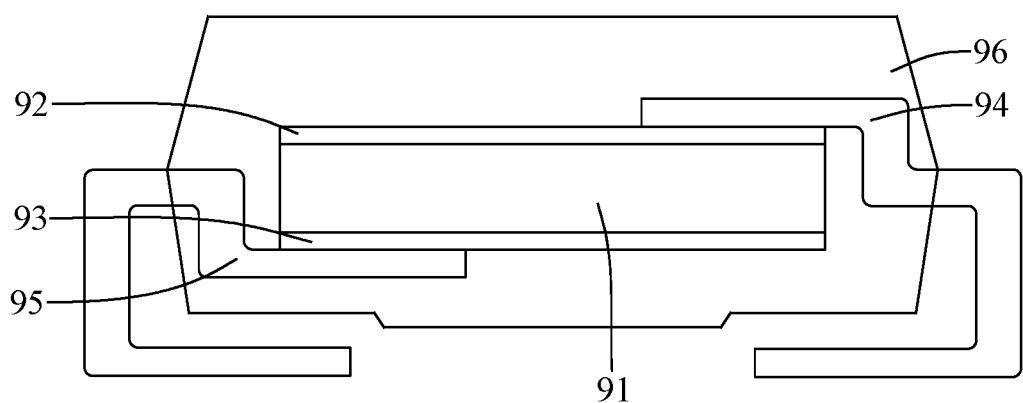
FIG. 1 is a conventional over-voltage protection device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
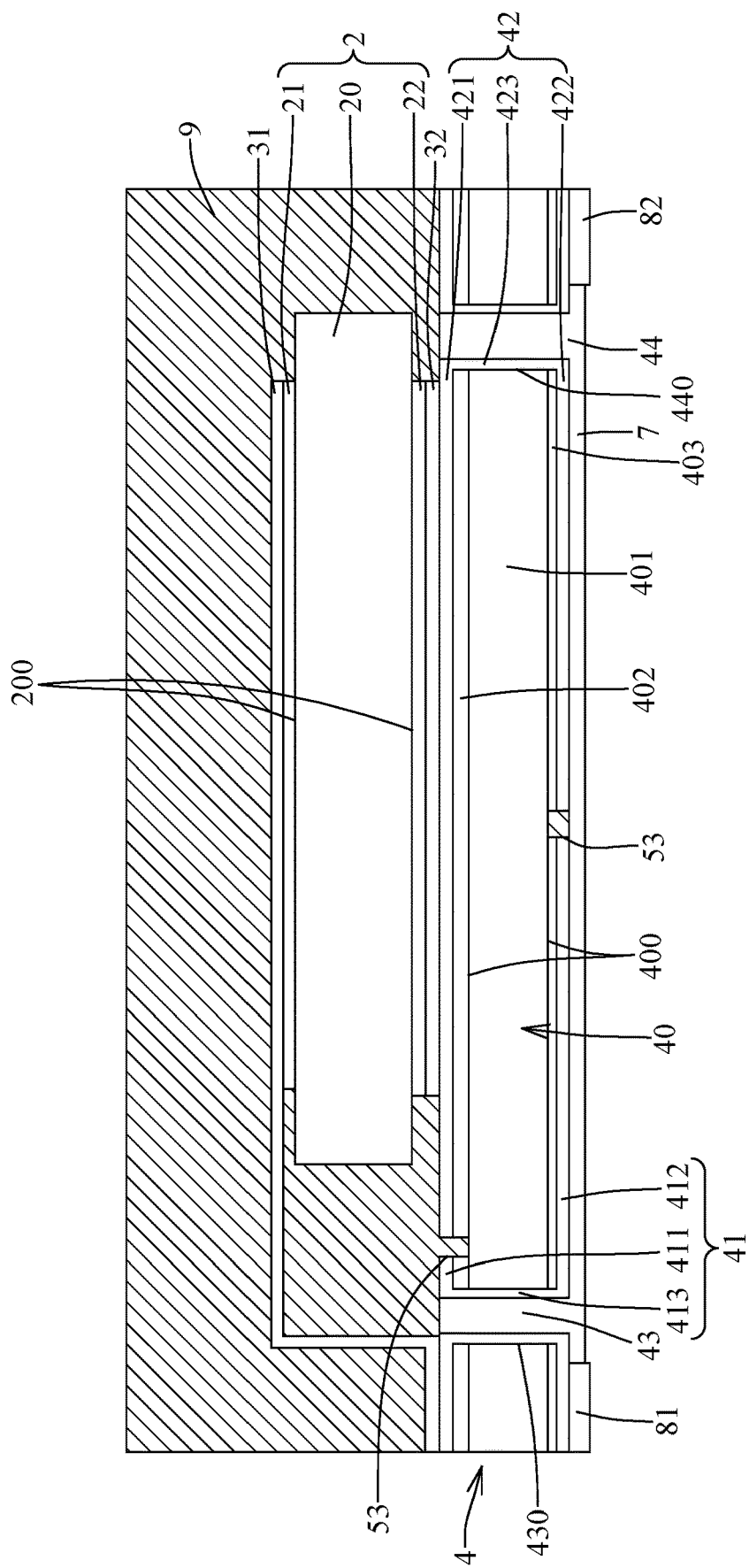
FIG. 2 is a cross-sectional schematic view illustrating an embodiment of an over-voltage protection device according to the present disclosure.
Figure 3:
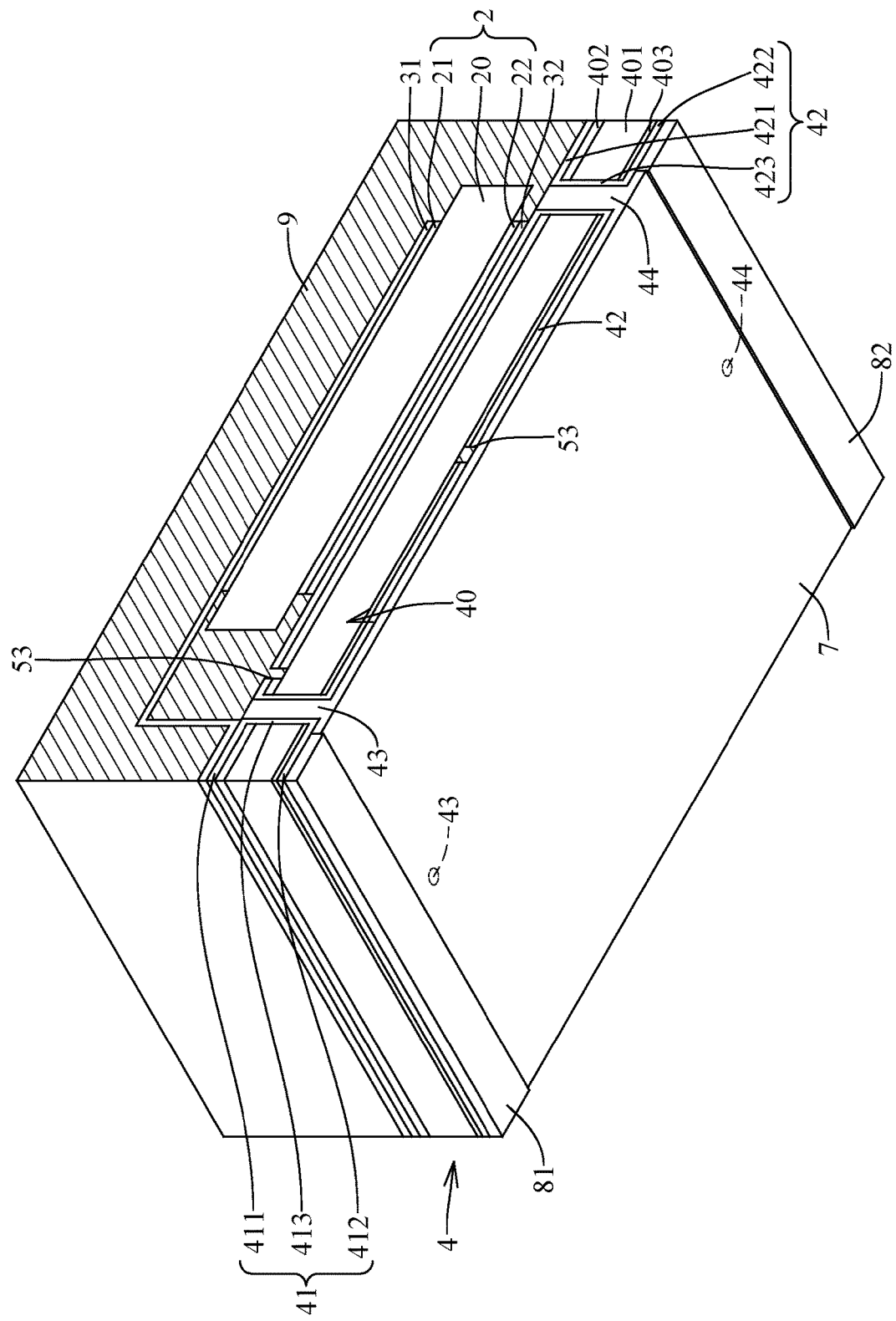
FIG. 3 is a perspective schematic view illustrating the embodiment of the over-voltage protection device according to the present disclosure.

Referring to FIGS. 2 and 3, an embodiment of an over-voltage protection device according to the present disclosure includes a voltage-dependent resistor component 2, a first conductive lead layer 31, a second conductive lead layer 32 and a printed circuit board (PCB) component 4.

The voltage-dependent resistor component 2 includes a voltage-dependent resistor layer 20 having two opposite resistor surfaces 200, and a first conductive layer 21 and a second conductive layer 22 respectively disposed on the opposite resistor surfaces 200 and connected to the voltage-dependent resistor layer 20. The voltage-dependent resistor layer 20 may be made of a metal-oxide material. The first conductive layer 21 and the second conductive layer 22 may be independently made of a silver-containing metallic material, so as to acquire a desired electrical property.

The first conductive lead layer 31 and the second conductive lead layer 32 are respectively disposed on the two opposite resistor surfaces 200 of the voltage-dependent resistor layer 20. In this embodiment, the first conductive lead layer 31 is disposed on and connected to the first conductive layer 21 opposite to the voltage-dependent resistor layer 20. The second conductive lead layer 32 is disposed on and connected to the second conductive layer 22 opposite to the voltage-dependent resistor layer 20.

The PCB component 4 may include a PCB body 40, at least one first conductive via 43, at least one second conductive via 44, a first conductive portion 41, a second conductive portion 42, and two etching holes 53.

The PCB body 40 may include a PCB layer 401 having two opposite PCB surfaces 400 that are respectively proximal to and distal from the voltage-dependent resistor component 2. The PCB body 40 may further include a third conductive layer 402 that is disposed on and connected to one of the two opposite PCB surfaces 400 that is proximal to the voltage-dependent resistor component 2, and a fourth conductive layer 403 that is disposed on and connected to the other one of the two opposite PCB surfaces 400 that is distal from the voltage-dependent resistor component 2.

The first conductive via 43 is formed to extend through the PCB body 40, and is defined by a first via-defining wall 430 which is covered by the first conductive portion 41 (to be described hereinafter).

The second conductive via 44 is formed to extend through the PCB body 40, and is defined by a second via-defining wall 440 which is covered by the second conductive portion 42 (to be described hereinafter).

In this embodiment, the over-voltage protection device includes a plurality of the first conductive vias 43 and/or a plurality of the second conductive vias 44. With such configuration, the over-voltage circuit protection device may have an improved reliability.

The first conductive portion 41 and the second conductive portion 42 are disposed on the PCB body 40, and are electrically insulated from each other. The first conductive portion 41 is bonded to the first conductive lead layer 31, and the second conductive portion 42 is bonded to the second conductive lead layer 32.

The first conductive portion 41 may include a first section 411 that is disposed on the third conductive layer 402, a second section 412 that is disposed on the fourth conductive layer 403, and a third section 413 that covers the first via-defining wall 430 of the first conductive via 43 and that interconnects the first and second sections 411, 412. The first section 411 of the first conductive portion 41 is soldered to the first conductive lead layer 31.

The second conductive portion 42 may include a first section 421 disposed on the third conductive layer 402, a second section 422 disposed on the fourth conductive layer 403, and a third section 423 that covers the second via-defining wall 440 of the second conductive via 44 and that interconnects the first and second sections 421, 422. The first section 421 of second conductive portion 42 is soldered to the second conductive lead layer 32.

The first and second conductive portions 41, 42 are electrically insulated from each other by the two etching holes 53 that respectively extends through the third conductive layer 402 and the fourth conductive layer 403 to expose the two PCB surfaces 400 of the PCB layer 401. The first section 411 of the first conductive portion 41 and the first section 421 of the second conductive portion 42 are spaced apart from each other by one of the two etching holes 53. The second section 412 of the first conductive portion 41 and the second section 422 of the second conductive portion 42 are separated from each other by the other one of the two etching holes 53. In certain embodiments, the two etching holes 53 are located between the first conductive via 43 and the second conductive via 44.

In certain embodiments, the first and second conductive portions 41, 42 are independently made of a conductive material, such as a conductive resin.

The over-voltage circuit protection device further includes a first electrode 81 that is electrically connected to the first conductive portion 41, and a second electrode 82 that is electrically connected to the second conductive portion 42. The first and second electrodes 81, 82 may be independently formed by an electro plating process.

The over-voltage circuit protection device further includes a solder resist layer 7 disposed on the PCB component 4 opposite to the voltage-dependent resistor component 2, and filling each of the first conductive via 43 and the second conductive via 44. In certain embodiments, the solder resist layer 7 is made of an epoxy resin.

The over-voltage circuit protection device may further include an encapsulant 9 covering the voltage-dependent resistor component 2, the first conductive lead layer 31 and the second conductive lead layer 32. In certain embodiments, the voltage-dependent resistor component 2, the first conductive lead layer 31 and the second conductive lead layer 32 are enclosed by the encapsulant 9. In certain embodiments, the voltage-dependent resistor component 2 is disposed between the PCB component 4 and the encapsulant 9. In certain embodiments, the encapsulant 9 fills the two etching holes 53. The encapsulant 9 may be made of epoxy resin.

The overvoltage protection device according to the present disclosure may be packaged as a surface mountable over-voltage protection device.

Examples of the disclosure will be described hereinafter. It is to be understood that these examples are exemplary and explanatory and should not be construed as a limitation to the disclosure.

EXAMPLES

Four types of metal oxide varistors (MOVs) (purchased from Ceramate Technical™ Co., Ltd, Catalogue Nos.: 05D180K, 05D751K, 07D180K and 07D821K, hereinafter referred to as MOV-1, MOV-2, MOV-3 and MOV-4, respectively) serving as the voltage-dependent resistor component were provided. Each type of the MOV included a MOV layer having two opposite surfaces, each having a diameter of 5.0 mm and a surface area of around 19.6 mm$^2$. The MOV also included a first conductive layer and a second conductive layer respectively disposed on the two opposite surfaces of the MOV layer. Each of the first and second conductive layers has a diameter of 4.7 mm and an area of 17.3 mm$^2$. The MOV was subjected to determination of a rated varistor voltage (i.e., a voltage at which the MOV is designed to work at 1 mA), a clamping voltage (i.e., a maximum voltage that the MOV can endure at a predetermined test pulse current and a test pulse waveform of 8/20 μs) and maximum surge currents (i.e., a maximum amount of current that the MOV can withstand) according to the Underwriters Laboratories® Underwriter Laboratories UL 1449 Standard for Surge Protective Devices (5$^{th}$ edition). The characteristic properties of each of the MOV-1 to MOV-4 are shown in Table 1.

TABLE 1

| | Rated varistor voltage$^a$ (V) | Clamping voltage$^b$ | | Maximum surge current$^c$ (A) | |
|---|---|---|---|---|---|
| | | Ip (A) | (V) | Once | 15 times |
| MOV-1 (05D180K) | 18 | 1.0 | 40 | 100 | 50 |
| MOV-2 (05D751K) | 750 | 5.0 | 1240 | 400 | 250 |
| MOV-3 (07D180K) | 18 | 2.5 | 36 | 250 | 150 |
| MOV-4 (07D821K) | 820 | 10.0 | 1355 | 1200 | 750 |

$^a$determined at 1 mA
$^b$determined at a test pulse waveform (tp) of 8/20 μs and a predetermined test pulse current (Ip)
$^c$determined at a test pulse waveform (tp) of 8/20 μs applied for once or fifteen times without causing the MOV to be malfunctioned or damaged Example 1 (E1)

First, a first conductive lead layer and a second conductive lead layer were respectively disposed on and connected to the first and second conductive layers of the MOV-1.

A printed circuit board (PCB) body (PCB, purchased from Nan Ya Plastic Corporation™, Catalogue no: UV BLOCK FR-4-86, with a thickness of 0.8 mm) was provided, and included a PCB layer, and a third conductive layer and a fourth conductive layer that are respectively disposed on two opposite PCB surfaces of the PCB layer. By performing a drilling process on the PCB body, a first conductive via and a second conductive via were formed to extend through the PCB layer and the third and fourth conductive layers. The resultant product was subjected to an electroplating process, so that a conductive resin was formed to cover the third and fourth conductive layers and a via-defining wall of each of the first and second conductive vias. Afterwards, by performing an etching process at a position in between the two conductive vias, a portion of the third conductive layer and a portion of the conductive resin disposed thereon were removed to form an etching hole which exposes one of the PCB surfaces, while a portion of the fourth conductive layer and a portion of the conductive resin disposed thereon were also removed to form another etching hole which exposes another one of the PCB surfaces. As such, the conductive resin was divided into a first conductive portion and a second conductive portion that were electrically insulated from each other through the etching holes, and a PCB component was therefore obtained in which the via-defining walls of the first and second conductive vias were respectively covered by the first and second conductive portions.

The resultant PCB component was connected to the MOV-1 with the first and second conductive portions being respectively bonded to the first and second conductive lead layers through a soldering process. A first electrode and a second electrode were then respectively formed on the first conductive portion and the second conductive portion of the PCB component opposite to the MOV-1 by electroplating. An encapsulant was then formed to enclose the MOV-1, so as to obtain an over-voltage protection device of E1. A solder resist layer was then formed on the resultant PCB component opposite to the MOV-1, and filled each of the first and second conductive vias.

Example 2 (E2)

The over-voltage protection device of E2 was prepared by procedures and conditions generally similar to those of E1, except that two of the first conductive vias and two of the second conductive vias were formed in the PCB component.

Examples 3 to 8 (E3 to E8)

The over-voltage protection devices of E3, E5 and E7 were prepared by procedures and conditions generally similar to those of E1, except that the MOV-1 adopted in E1 was replaced with the MOV-2 in E3, the MOV-3 in E5 and the MOV-4 in E7.

The over-voltage protection devices of E4, E6 and E8 were prepared by procedures and conditions generally similar to those of E2, except that the MOV adopted in E2 was replaced with the MOV-2 in E4, the MOV-3 in E6 and the MOV-4 in E8.

Comparative Examples 1 to 4 (CE1 to CE4)

Each of the over-voltage protection devices of CE1 to CE4 included only a respective one of the MOV-1 to MOV-4 enclosed by an encapsulant.
Performance Test
Varistor Voltage Test Ten over-voltage protection devices of each of E1 to E8 and CE1 to CE4, serving as test devices, were subjected to a varistor voltage test using a surge absorber tester (purchased from Think Technologies™ Co., Ltd.; Model No.: MOV-168EP) under a test condition of 1 mA. The average varistor voltages of the over-voltage protection devices of each of E1 to E8 and CE1 to CE4 are shown in Table 2.
Clamping Voltage Test Ten over-voltage protection devices of each of E1 to E8 and CE1 to CE4, serving as test devices, were subjected to a clamping voltage test so as to determine the maximal clamping voltage of the test devices. The clamping voltage test was conducted at a fixed test pulse current (Ip=1 A, 2.5 A, 5 A or 10 A) and an impulse waveform of 8/20 μs using a surge protection device tester (purchased from EMC Master Instrument™ Co., Ltd.; Model No.: MIG0603CLV1). The average clamping voltages of the over-voltage protection devices of each of E1 to E8 and CE1 to CE4 are shown in Table 2.
Maximum Surge Current Test Ten overvoltage protection devices of each of E1 to E8 and CE1 to CE4, serving as test devices, were subjected to a maximum surge current test using a surge protection device tester purchased from EMC Master Instrumen™ Co., Ltd.; Model No.: MIG0624LP1) so as to determine the maximum surge current that such devices can endure. The maximum surge current test was conducted at a test pulse waveform of 8/20 μs which was applied for once or fifteen times without causing the test devices malfunctioning or being damaged. The average maximum surge currents of the over-voltage protection devices of each of E1 to E8 and CE1 to CE4 are shown in Table 2.

TABLE 2

|  | MOV | Number of conductive vias | Varistor voltage (V) | Clamping voltage | | Maximum surge current (A) | |
| --- | --- | --- | --- | --- | --- | --- | --- |
|  |  |  |  | Ip (A) | (V) | Once | 15 times |
| E1 | MOV-1 | 2 | 18.1 | 1.0 | 33.5 | 122.5 | 81.6 |
| E2 | MOV-1 | 4 | 18.0 | 1.0 | 33.0 | 125.4 | 84.0 |
| E3 | MOV-2 | 2 | 745.2 | 5.0 | 1153.4 | 463.5 | 309.0 |
| E4 | MOV-2 | 4 | 746.7 | 5.0 | 1143.5 | 472.6 | 318.6 |
| E5 | MOV-3 | 2 | 18.2 | 2.5 | 33.3 | 290.4 | 193.8 |
| E6 | MOV-3 | 4 | 18.1 | 2.5 | 32.9 | 298.8 | 199.6 |
| E7 | MOV-4 | 2 | 815.5 | 10.0 | 1321.4 | 1340.8 | 893.2 |
| E8 | MOV-4 | 4 | 816.3 | 10.0 | 1315.8 | 1385.2 | 925.4 |
| CE1 | MOV-1 | N/A | 18.1 | 1.0 | 34.5 | 108.2 | 72.0 |
| CE2 | MOV-2 | N/A | 745.5 | 5.0 | 1180.2 | 435.8 | 288.5 |
| CE3 | MOV-3 | N/A | 18.1 | 2.5 | 34.6 | 268.5 | 178.8 |
| CE4 | MOV-4 | N/A | 815.9 | 10.0 | 1330.0 | 1285.0 | 846.5 |

Note:
"N/A" indicates not applicable

As shown in Table 2, for each of the over-voltage protection devices of E1 to E8 and CE1 to CE4, the varistor voltage thus determined is generally similar to the characteristic rated varistor voltage of the corresponding one of the MOVs (see Table 1). That is, each of the over-voltage protection devices of E1 to E8, which includes the MOV connected to the PCB component with at least two conductive vias, is capable of functioning at the characteristic rated varistor voltage of the corresponding one of the MOVs adopted therein.

In the clamping voltage test, for each of E1 to E8 and CE1 to CE4, the over-voltage protection device has a clamping voltage lower than the characteristic clamping voltage of the corresponding one of the MOVs. Specifically, when comparing the results of E1, E2 and CE1 which include the same MOV-1, each of the over-voltage protection devices of E1 and E2 has a clamping voltage less than that of CE1, indicating that the over-voltage protection device according to the present disclosure including the MOV connected to the PCB component with at least two conductive vias is capable of maintaining a relatively low voltage during a surge event so as to protect the components in such device from damage. Moreover, the over-voltage protection device of E2 has an even smaller clamping voltage than that of E1, indicating that the presence of more conductive vias in the PCB component of the device are conducive to dissipating surge energy, and maintaining the clamping voltage at a lower level. Similar results are also observed when the over-voltage protection devices of E3, E4 and CE2 are compared, when the over-voltage protection devices of E5, E6 and CE3 are compared, and when the over-voltage protection devices of E7, E8 and CE4 are compared.

In the maximum surge current test, regardless of applying the test pulse once or fifteen times, each of the over-voltage protection devices of E1 to E8 and CE1 to CE4 has maximum surge current greater than the characteristic maximum surge currents of the corresponding one of the MOVs. Specifically, when comparing the results of E1, E2 and CE1, each of the over-voltage protection devices of E1 and E2 has maximum surge currents greater than those of CE1, indicating that the over-voltage protection device according to the present disclosure including the MOV connected to the PCB component with at least two conductive vias is capable of withstanding a relatively high surge current, and is less likely to be damaged in a surge event. Moreover, the over-voltage protection device of E2 has greater maximum surge currents than those of E1, indicating that the over-voltage protection device of E2 having more conductive vias in the PCB component can dissipate surge energy, and thus may endure a higher current level. Similar results are also observed when the over-voltage protection devices of E3, E4 and CE2 are compared, when the over-voltage protection devices of E5, E6 and CE3 are compared, and when the over-voltage protection devices of E7, E8 and CE4 are compared.

To conclude, by virtue of including the PCB component having at least two conductive vias, the over-voltage circuit protection device of the present disclosure exhibits a relatively low clamping voltage and a relatively high maximum surge current during a surge event, and thus improved circuit protection performance is achieved.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it understood that this disclosure is not limited to the disclosed embodiment but is intended to cover various arrangements included within the spirit and scope of the broadest interpretation so as to encompass all such modifications and equivalent arrangements.

What is claimed is:

1. An over-voltage circuit protection device, comprising:
   a voltage-dependent resistor component having two opposite resistor surfaces;
   a first conductive lead layer and a second conductive lead layer respectively disposed on said two opposite resistor surfaces of said voltage-dependent resistor component; and
   a printed circuit board (PCB) component including
   a PCB body;
   a first conductive portion that is disposed on said PCB body and that is bonded to said first conductive lead layer;
   a second conductive Portion that is disposed on said PCB body, that is electrically insulated from said first conductive portion, and that is bonded to said second conductive lead layer;
   at least one first conductive via that is formed to extend through said PCB body, and that is defined by a first via-defining wall which is covered by said first conductive portion; and
   at least one second conductive via that is formed to extend through said PCB body, and that is defined by a second via-defining wall which is covered by said second conductive portion.

2. The over-voltage circuit protection device of claim 1, wherein said PCB component includes a plurality of first conductive vias.

3. The over-voltage circuit protection device of claim 1, wherein said PCB component includes a plurality of second conductive vias.

4. The over-voltage circuit protection device of claim 1, wherein said voltage-dependent resistor component includes
   a voltage-dependent resistor layer having said two opposite resistor surfaces,
   a first conductive layer interposed between and connected to said first conductive lead layer and one of said two opposite resistor surfaces of said voltage-dependent resistor layer, and
   a second conductive layer interposed between and connected to said second conductive lead layer and the other one of said two opposite resistor surfaces of said voltage-dependent resistor layer.

5. The over-voltage circuit protection device of claim 4, wherein said voltage-dependent resistor layer is made of a metal oxide material.

6. The over-voltage circuit protection device of claim 4, wherein said first conductive layer and said second conductive layer are independently made of a silver-containing metallic material.

7. The over-voltage circuit protection device of claim 1, further comprising an encapsulant covering said voltage-dependent resistor component, said first conductive lead layer and said second conductive lead layer.

8. The over-voltage circuit protection device of claim 7, wherein said voltage-dependent resistor component is disposed between said PCB component and said encapsulant.

9. The over-voltage circuit protection device of claim 7, wherein said encapsulant is made of epoxy resin.

10. The over-voltage circuit protection device of claim 1, further comprising a first electrode electrically connected to said first conductive portion, and a second electrode electrically connected to said second conductive portion.

11. The over-voltage circuit protection device of claim 1, further comprising a solder resist layer disposed on said PCB component opposite to said voltage-dependent resistor component and filling each of said first conductive via and said second conductive via.

12. The over-voltage circuit protection device of claim 1, wherein said PCB body includes a PCB layer having two opposite PCB surfaces that are respectively proximal to and distal from said voltage-dependent resistor component;

a third conductive layer disposed on and connecting to one of said two opposite PCB surfaces that is proximal to said voltage-dependent resistor component, and a fourth conductive layer disposed on and connecting to the other one of said two opposite PCB surfaces that is distal from said voltage-dependent resistor component.

13. The over-voltage circuit protection device of claim 12, wherein said PCB component further includes two etching holes by which said first and second conductive portions are electrically insulated from each other, said two etching holes respectively extending through said third conductive layer and said fourth conductive layer to expose said two opposite PCB surfaces of said PCB layer.

* * * * *